United States Patent
Goto et al.

(10) Patent No.: US 11,018,485 B2
(45) Date of Patent: May 25, 2021

(54) EXPLOSION-PROOF STRUCTURE

(71) Applicant: YOKOGAWA ELECTRIC CORPORATION, Tokyo (JP)

(72) Inventors: Moe Goto, Musashino (JP); Yuichi Hayashi, Musashino (JP); Kazutoshi Okamoto, Musashino (JP); Shuo Huang, Musashino (JP); Shinichi Mimura, Musashino (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 25 days.

(21) Appl. No.: 16/531,081

(22) Filed: Aug. 4, 2019

(65) Prior Publication Data
US 2020/0052472 A1   Feb. 13, 2020

(30) Foreign Application Priority Data
Aug. 7, 2018 (JP) .............................. JP2018-148836

(51) Int. Cl.
*H02G 3/08* (2006.01)
*H05K 5/06* (2006.01)

(52) U.S. Cl.
CPC ............. *H02G 3/083* (2013.01); *H02G 3/088* (2013.01); *H05K 5/069* (2013.01)

(58) Field of Classification Search
CPC .......... H02G 3/08; H02G 3/083; H02G 3/088; H05K 5/069; H05K 5/0247
See application file for complete search history.

(56) References Cited

U.S. PATENT DOCUMENTS

| | | |
|---|---|---|
| 7,147,485 B2 | 12/2006 | Ohta et al. |
| 2011/0094880 A1 | 4/2011 | Schlichte et al. |

FOREIGN PATENT DOCUMENTS

| | | |
|---|---|---|
| CN | 202215850 U | 5/2012 |
| CN | 104347968 A | 2/2015 |
| CN | 104505973 A | 4/2015 |
| EP | 0375271 A2 | 6/1990 |
| JP | 2-27298 U | 2/1990 |
| JP | 2-118861 U | 9/1990 |
| JP | H07036105 U | 7/1995 |
| JP | 2005-147844 A1 | 6/2005 |
| JP | 2013-4200 A | 1/2013 |

*Primary Examiner* — Timothy J Thompson
*Assistant Examiner* — Amol H Patel
(74) *Attorney, Agent, or Firm* — Rankin, Hill & Clark LLP

(57) ABSTRACT

An explosion-proof structure includes a partition wall that partitions a sealed space in a container and wiring that connects the interior and the exterior of the sealed space. The partition wall includes a filling portion through which the wiring passes. The filling portion includes an inner peripheral wall surface that defines an opening having a central axis that passes through the partition wall, a filler that seals a gap between the inner peripheral wall surface and the wiring, a first peripheral groove provided on the inner peripheral wall surface and filled with the filler, and a second peripheral groove provided on the inner peripheral wall surface and filled with the filler. This explosion-proof structure is capable of improving the seal of the filling portion.

7 Claims, 3 Drawing Sheets

EXPLOSION-PROOF STRUCTURE

CROSS-REFERENCE TO RELATED APPLICATION

The present application claims priority to and the benefit of Japanese Patent Application No. 2018-148836 filed Aug. 7, 2018, the entire contents of which are incorporated herein by reference.

TECHNICAL FIELD

The present disclosure relates to an explosion-proof structure.

BACKGROUND

Field devices and the like used in plants and other locations are sometimes required to have an explosion-proof structure, such as a flameproof structure. A known explosion-proof structure includes a partition wall that partitions a sealed space in a container and wiring that connects the interior and the exterior of the sealed space. The partition wall includes a filling portion through which the wiring passes. For example, in the explosion-proof structure disclosed in FIG. 1 of patent literature (PTL) 1, the filling portion includes an inner peripheral wall surface that defines an opening, a filler that seals a gap between the inner peripheral wall surface and the wiring, and only one peripheral groove provided on the inner peripheral wall surface and filled with the filler.

CITATION LIST

Patent Literature

PTL 1: JP H07-36105U

SUMMARY

An explosion-proof structure according to an embodiment includes a partition wall that partitions a sealed space in a container and wiring that connects the interior and the exterior of the sealed space. The partition wall includes a filling portion through which the wiring passes. The filling portion includes an inner peripheral wall surface that defines an opening having a central axis that passes through the partition wall, a filler that seals a gap between the inner peripheral wall surface and the wiring, a first peripheral groove provided on the inner peripheral wall surface and filled with the filler, and a second peripheral groove provided on the inner peripheral wall surface and filled with the filler.

DETAILED DESCRIPTION

Figure 1:
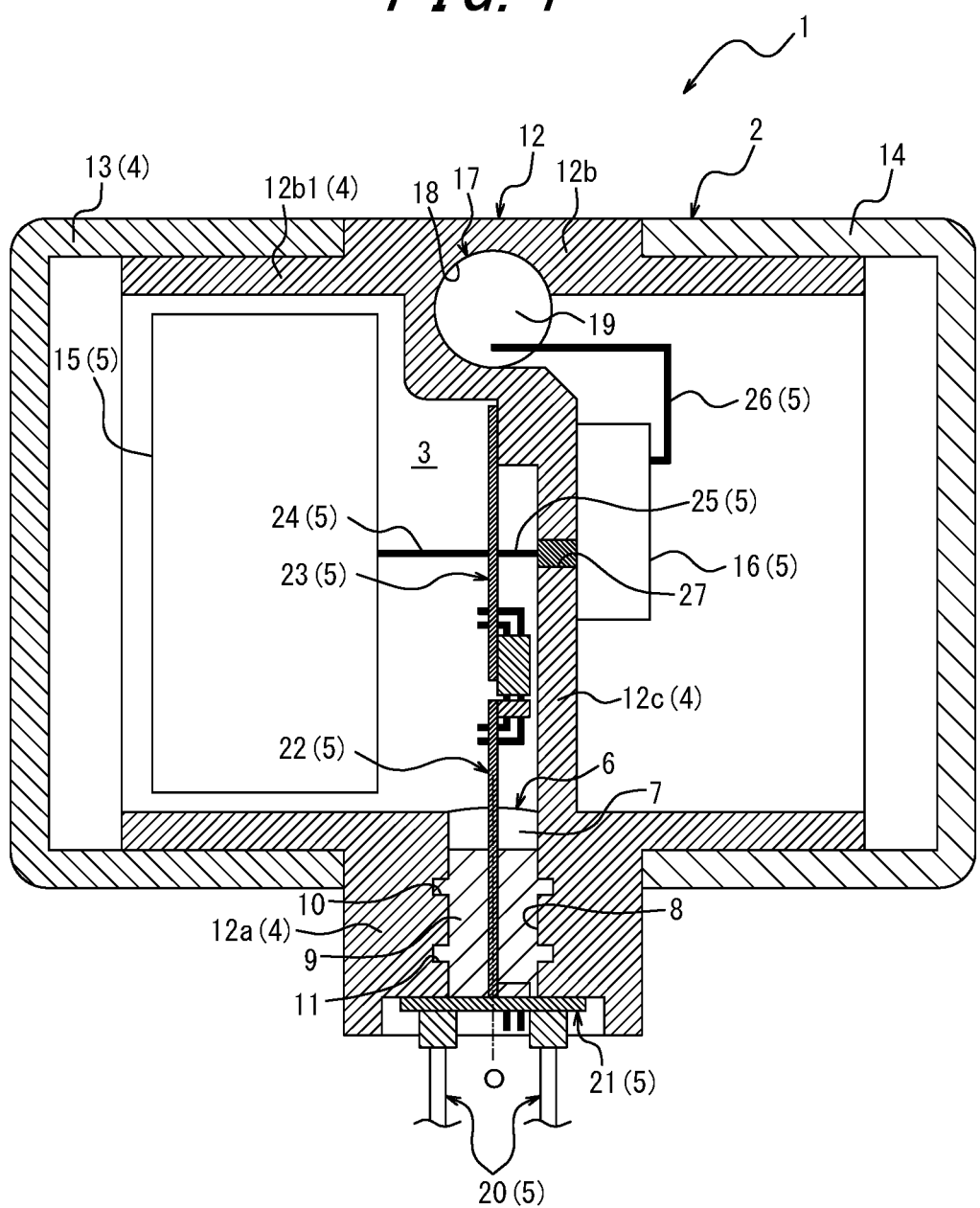
FIG. 1 is a cross-sectional diagram schematically illustrating an explosion-proof structure according to an embodiment of the present disclosure.

In the explosion-proof structure disclosed in PTL 1, the difference in the linear expansion coefficient between the inner peripheral wall surface, the filler, and the wiring causes thermal stress to be produced along with a change in the surrounding temperature. This tends to reduce the adhesive force between the filler and the inner peripheral wall surface, and between the filler and the wiring. The seal of the filling portion thus has room for improvement. It is therefore desirable to be able to provide an explosion-proof structure that can improve the seal of the filling portion.

An explosion-proof structure according to an embodiment includes a partition wall that partitions a sealed space in a container and wiring that connects the interior and the exterior of the sealed space. The partition wall includes a filling portion through which the wiring passes. The filling portion includes an inner peripheral wall surface that defines an opening having a central axis that passes through the partition wall, a filler that seals a gap between the inner peripheral wall surface and the wiring, a first peripheral groove provided on the inner peripheral wall surface and filled with the filler, and a second peripheral groove provided on the inner peripheral wall surface and filled with the filler. With this configuration, even if the difference in the linear expansion coefficient between the inner peripheral wall surface and the filler causes thermal stress to be produced along with a change in the surrounding temperature, a latching force resisting the thermal stress in the axial direction along the central axis can be produced between the filler and the inner peripheral wall surface at the first peripheral groove and the second peripheral groove. Accordingly, the occurrence or progression of separation between the filler and the inner peripheral wall surface can be suppressed in particular at the portion between the first peripheral groove and the second peripheral groove.

In an embodiment, at least one of the first peripheral groove and the second peripheral groove may be provided continuously around the entire periphery. This configuration can effectively improve the seal of the filling portion.

In an embodiment, the cross-sectional shape of at least one of the first peripheral groove and the second peripheral groove in a cross-section including the central axis may be rectangular or square, and the rectangular or square cross-sectional shape may have a chamfered portion in which the corners are C chamfered, R chamfered, or the like. This configuration can effectively improve the seal of the filling portion.

In an embodiment, the wiring may be configured by at least one of an electrical conductor and a photoconductor. The electrical conductor may be configured by at least one of electrical wiring, such as a lead wire, a cable, or the like; a substrate; a circuit; and a power source. The circuit may be configured by at least one of an amplifier, an A/D converter, and an arithmetic processing device. The photoconductor may be configured by optical wiring such as an optical fiber. To simplify the structure, however, the wiring is preferably configured by an electrical conductor that does not include a photoconductor.

In an embodiment, the wiring may include a through substrate formed by a substrate that passes through the filling portion. This configuration can increase the adhesive force between the wiring and the filler and can increase the durability of the wiring, at the filling portion, with respect to explosion pressure produced by an explosion in the sealed space.

In an embodiment, the wiring may include an internal fixing member fixed to the container inside the sealed space, and an axial gap may be provided between the through substrate and the internal fixing member to allow the through substrate and the internal fixing member to approach each other closely in the axial direction along the central axis. This configuration allows the expansion and contraction in the axial direction, produced along the entire through substrate and internal fixing member due to heat, to be absorbed by a change in the axial gap. The occurrence or progression of separation between the through substrate and the filler can thereby be suppressed.

In an embodiment, the internal fixing member may be an internal fixing substrate formed by a substrate. This configuration allows the structure of the wiring to be simplified effectively.

In an embodiment, the through substrate may include a sliding connector formed by a connector pinned slidably in the axial direction with respect to the internal fixing member. This configuration allows the axial gap to be formed at a low cost and can also achieve better ease of assembly.

In an embodiment, the wiring may include an external fixing member fixed to the partition wall so as to cover the opening at the outside of the sealed space. This configuration allows the external fixing member to effectively suppress the filler from flying out due to the explosion pressure produced by an explosion in the sealed space.

In an embodiment, the external fixing member may be an external fixing substrate formed by a substrate. When the wiring includes the through substrate, this configuration allows the through substrate to be connected to the external fixing substrate by a connector, thereby achieving better ease of assembly.

In an embodiment, the first peripheral groove and the second peripheral groove may be disposed on either side of the center of the filler in the axial direction along the central axis. This configuration allows the occurrence or progression of separation between the filler and the inner peripheral wall surface, due to a change in the surrounding temperature, to be suppressed effectively by a latching force produced by the first peripheral groove and the second peripheral groove.

In an embodiment, the filler may be made of resin. This configuration can effectively improve the seal of the filling portion.

In an embodiment, the filling portion may include another filler that is adjacent to the filler and has a larger elasticity than the filler. This configuration can improve the seal of the filling portion.

In an embodiment, the other filler may be made of resin. This configuration can effectively improve the seal of the filling portion.

In an embodiment, the other filler may be adjacent to the filler on the sealed space side of the filler. This configuration can effectively improve the seal of the filling portion.

In an embodiment, the container may be a flameproof enclosure. This configuration can achieve an explosion-proof structure in accordance with flameproof standards.

The present disclosure can provide an explosion-proof structure capable of improving the seal of the filling portion.

An explosion-proof structure 1 according to an embodiment of the present disclosure is described in detail, with reference to the drawings.

Figure 2:
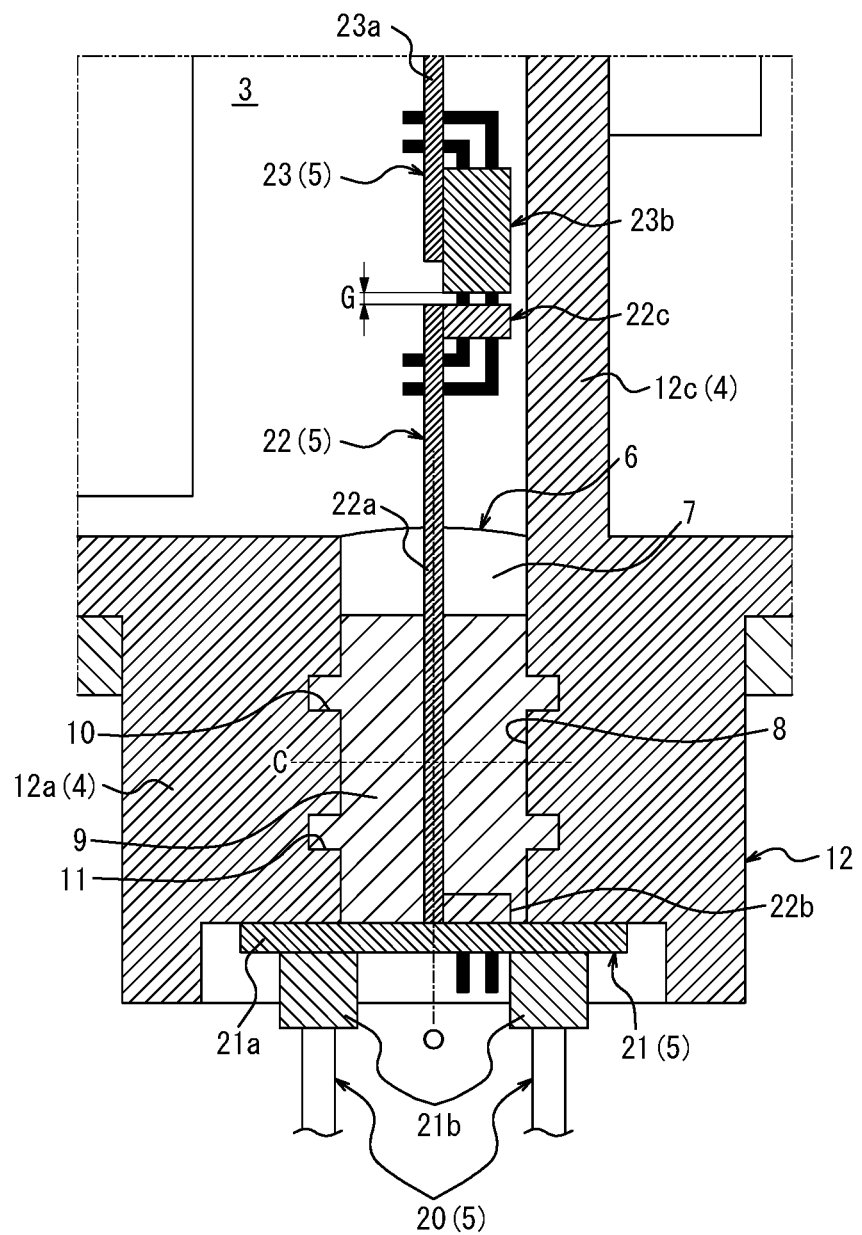
FIG. 2 is an enlarged view of a portion of FIG. 1.

As illustrated in FIG. 1 and FIG. 2, an explosion-proof structure 1 according to the present embodiment includes a partition wall 4 that partitions a sealed space 3 in a container 2 and an electrical conductor 5 (wiring) that connects the interior and the exterior of the sealed space 3. The partition wall 4 includes a filling portion 6 through which the electrical conductor 5 passes. The filling portion 6 includes an inner peripheral wall surface 8 that defines an opening 7 having a central axis O that passes through the partition wall 4, a filler 9 that seals the gap between the inner peripheral wall surface 8 and the electrical conductor 5, a first peripheral groove 10 provided on the inner peripheral wall surface 8 and filled with the filler 9, and a second peripheral groove 11 provided on the inner peripheral wall surface 8 below the first peripheral groove 10 and filled with the filler 9.

In the present embodiment, the central axis O refers to the central axis O of the opening 7. The axial direction refers to the direction along the central axis O, the radial direction refers to the direction orthogonal to the central axis O, and the peripheral direction refers to the direction around the central axis O. For the sake of explanation, the direction from the filling portion 6 towards the sealed space 3 along the central axis O is referred to as "upward" or "above", and the opposite direction is referred to as "downward" or "below".

In the present embodiment, the container 2 is a flameproof enclosure for a transducer forming a sensor device as a field device used in a plant. The container 2, however, may be a container for a field device other than such a transducer. Examples of the field device include sensor devices such as pressure gauges, flow meters, and temperature sensors; valve devices, such as flow control valves and opening/closing valves; actuators, such as fans or motors; image capturing devices, such as cameras and video recorders, that capture images of the conditions and objects in the plant; acoustic devices, such as microphones that collect abnormal noises and the like inside the plant and speakers that emit warning sounds or the like; position detectors that output position information of various devices; and other such devices. Examples of the plant include an industrial plant such as a chemical plant; a plant for managing a well site, such as a gas field or oil field, and the surrounding area; a plant for managing power generation such as hydroelectric power, thermal power, nuclear power, or the like; a plant for managing environmental power generation such as solar power, wind power, or the like; and a plant for managing water and sewage, a dam, or the like.

The container 2 is formed by a case 12, an amplifier chamber cover 13, and a terminal chamber cover 14. The case 12 includes a tubular wall 12a that has the inner peripheral wall surface 8, a tubular peripheral wall 12b connected to the upper end of the tubular wall 12a and centered on an axis orthogonal to the central axis O, and a barrier wall 12c that separates the space inside the peripheral wall 12b in two. The outer peripheral edge of the barrier wall 12c is connected to the inner peripheral surface of the peripheral wall 12b over the entire periphery. One end of the peripheral wall 12b is sealed by the amplifier chamber cover 13, one end of which forms a closed tube. The partition wall 4 that partitions the sealed space 3 is formed by a portion 12b1 at one end of the peripheral wall 12b, the barrier wall 12c, the amplifier chamber cover 13, and the filling portion 6. The partition wall 4 forms an amplification chamber housing a circuit 15 that includes an amplifier. The other end of the peripheral wall 12b is sealed by the terminal chamber cover 14, one end of which forms a closed tube. A power source terminal chamber housing a power source terminal 16 is formed by a portion at the other end of the peripheral wall 12b, the barrier wall 12c, and the terminal chamber cover 14. The portion at the other end of the peripheral wall 12b includes a seal 17 through which a third electrical wire 26 of the electrical conductor 5 passes. The seal 17 includes a wiring entrance 18 and packing 19 that seals the wiring entrance 18. In the present embodiment, the case 12, the amplifier chamber cover 13, and the terminal chamber cover 14 are, for example, made of a metal such as aluminum.

The electrical conductor 5 includes sensor signal lines 20, an external fixing substrate 21 (external fixing member), a through substrate 22, an internal fixing substrate 23 (internal fixing member), a first electrical wire 24, the circuit 15, a second electrical wire 25, the power source terminal 16, and the third electrical wire 26. The external fixing substrate 21, the through substrate 22, and the internal fixing substrate 23 are each configured as a rigid substrate.

The lower ends of the sensor signal lines 20 are connected to a non-illustrated sensor. The external fixing substrate 21 includes a substrate body 21a and connectors 21b. The substrate body 21a is fixed by a fastening body, such as a screw, to the tubular wall 12a so as to cover the opening 7 at the outside of the sealed space 3. The connectors 21b are fixed by soldering to the substrate body 21a and connected to the upper ends of the sensor signal lines 20. The substrate body 21a of the external fixing substrate 21 is disposed to extend perpendicularly to the axial direction. The through substrate 22 includes a substrate body 22a that passes through the filling portion 6, a connector 22b fixed by soldering to the lower end of the substrate body 22a, and a sliding connector 22c fixed by soldering to the upper end of the substrate body 22a. The substrate body 22a of the through substrate 22 is disposed to extend in the axial direction. Accordingly, the substrate body 22a of the through substrate 22 is disposed perpendicularly to the substrate body 21a of the external fixing substrate 21. The connector 22b of the through substrate 22 includes a pin that passes through the substrate body 21a of the external fixing substrate 21 and is fixed by soldering to the substrate body 21a.

The sliding connector 22c of the through substrate 22 is formed by a connector pinned slidably in the axial direction with respect to the internal fixing substrate 23. The internal fixing substrate 23 includes a substrate body 23a and a connector 23b. The upper end of the substrate body 23a is fixed by a fastening body, such as a screw, to the barrier wall 12c inside the sealed space 3. The connector 23b is fixed by soldering to the lower end of the substrate body 23a. The substrate body 23a of the internal fixing substrate 23 is aligned with the substrate body 22a of the through substrate 22 above the substrate body 22a.

The sliding connector 22c of the through substrate 22 includes a connector base fixed to the substrate body 22a and pins extending upward from the connector base. The connector 23b of the internal fixing substrate 23 includes a connector base fixed to the substrate body 23a and a socket provided at the lower end of the connector base. The pins of the sliding connector 22c are inserted in the socket of the connector 23b of the internal fixing substrate 23 slidably in the axial direction and ensures electrical conduction. Between the connector base of the sliding connector 22c of the through substrate 22 and the connector base of the connector 23b of the internal fixing substrate 23, an axial gap G (see FIG. 2) is provided to allow the through substrate 22 and the internal fixing substrate 23 to approach each other closely in the axial direction, i.e. to prevent the connector bases from interfering with each other. Alternatively, a socket may be provided in the connector base of the sliding connector 22c of the through substrate 22, and a pin may be provided in the connector base of the connector 23b of the internal fixing substrate 23.

The internal fixing substrate 23 and the circuit 15 are connected to each other by the first electrical wire 24. The internal fixing substrate 23 and the power source terminal 16 are connected to each other by the second electrical wire 25. The barrier wall 12c includes a seal 27 through which the second electrical wire 25 passes. The seal 27 is configured by a through hole having a female screw into which a male screw of a through capacitor provided in the second electrical wire 25 can be screwed. The power source terminal 16 is connected to the exterior of the sensor device (an external power source chamber, an instrumentation chamber, a gauge chamber, or the like) via the third electrical wire 26.

The power source terminal 16 can supply power, supplied from an external source through the third electrical wire 26, to the circuit 15 or the like through the second electrical wire 25 and the first electrical wire 24. The circuit 15 can generate an internal power source with the supplied power, operate the circuit interior and the sensor, and receive an electric signal (sensor signal) from the sensor through the sensor signal lines 20, the through substrate 22, the internal fixing substrate 23, and the first electrical wire 24. The circuit 15 can also amplify and perform arithmetic processing on the received sensor signal and output the resulting signal to the exterior through the second electrical wire 25, the power source terminal 16, and the third electrical wire 26.

The first peripheral groove 10 and the second peripheral groove 11 are disposed on either side of a center C of the filler 9 in the axial direction. The inner peripheral wall surface 8 has a cylindrical shape centered on the central axis O. The first peripheral groove 10 and the second peripheral groove 11 each have a ring shape centered on the central axis O. The first peripheral groove 10 and the second peripheral groove 11 are each preferably provided continuously around the entire periphery, as in the present embodiment, but this configuration is not limiting. Each groove may be intermittent in the peripheral direction. The cross-sectional shape of the first peripheral groove 10 and the second peripheral groove 11 in a cross-section including the central axis O is rectangular. The cross-sectional shape of at least one of the first peripheral groove 10 and the second peripheral groove 11 may be square, however. The rectangular or square cross-sectional shape may have chamfered portions in which the corners are C chamfered, R chamfered, or the like. The first peripheral groove 10 and the second peripheral groove 11 can, for example, be processed by a lathe, a milling machine, or the like to form the inner peripheral wall surface 8. In the present embodiment, the filler 9 is a structural adhesive made of resin, such as epoxy resin.

The portion around the filling portion 6 can, for example, be assembled as follows. First, the external fixing substrate 21 is connected perpendicularly to the through substrate 22 to form an assembly. Next, the sliding connector 22c of the assembly is pinned to the socket of the internal fixing substrate 23, and the substrate body 21a of the assembly is fixed to the tubular wall 12a. Subsequently, the filler 9 is injected through the opening 7 from the inside of the container 2 to seal the gap between the inner peripheral wall surface 8 and the wiring 5 and to fill the first peripheral groove 10 and the second peripheral groove 11. The filler 9 is then fixed under predetermined hardening conditions.

Figure 3:
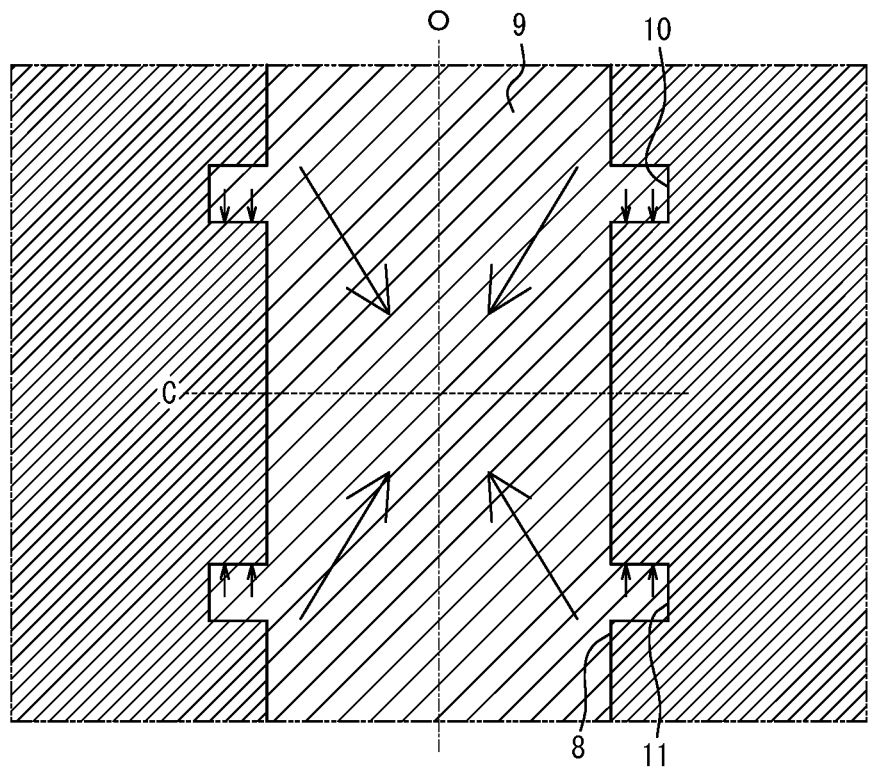
FIG. 3 is a cross-sectional diagram illustrating axial-direction thermal stress produced by the filler when the surrounding temperature falls at the filling portion illustrated in FIG. 1, the wiring being omitted from FIG. 3.

The explosion-proof structure 1 according to the present embodiment achieves the following effects with regard to thermal stress that is produced along with a change in the surrounding temperature. When the temperature of the container 2 changes, a relatively large thermal stress is produced on the joining surface due to the difference in the linear expansion coefficient between the filler 9 and the surrounding members. Expansion and contraction of the filler 9 due to the temperature change produces an axial separation force and a radial separation force on the joining surface between the filler 9 and the inner peripheral wall surface 8. FIG. 3 illustrates the axial force produced on the first peripheral groove 10 and the second peripheral groove 11 when the filler 9 contracts towards the center of the filler 9 due to a temperature change. As described above, the first peripheral groove 10 and the second peripheral groove 11 are disposed on either side of the center C of the filler 9 in the axial direction. When the filler 9 contracts towards the center of the filler 9, forces in opposite directions act on the lower surface of the first peripheral groove 10 and the upper surface of the second peripheral groove 11. The first peripheral groove 10 and the second peripheral groove 11 can thereby produce a latching force that resists the thermal stress in the axial direction. Accordingly, the occurrence or progression of separation between the filler 9 and the inner peripheral wall surface 8 can be suppressed in particular at the portion between the first peripheral groove 10 and the second peripheral groove 11. When only one groove is provided, such an effect is not obtained, and separation tends to occur in response to an axial force. Furthermore, separation tends to occur near the upper surface and the lower surface of the filler 9, where stress is concentrated. The first peripheral groove 10 is therefore preferably provided near the upper surface of the filler 9, and the second peripheral groove 11 is preferably provided near the lower surface of the filler 9, to suppress the occurrence or progression of separation.

Figure 4:
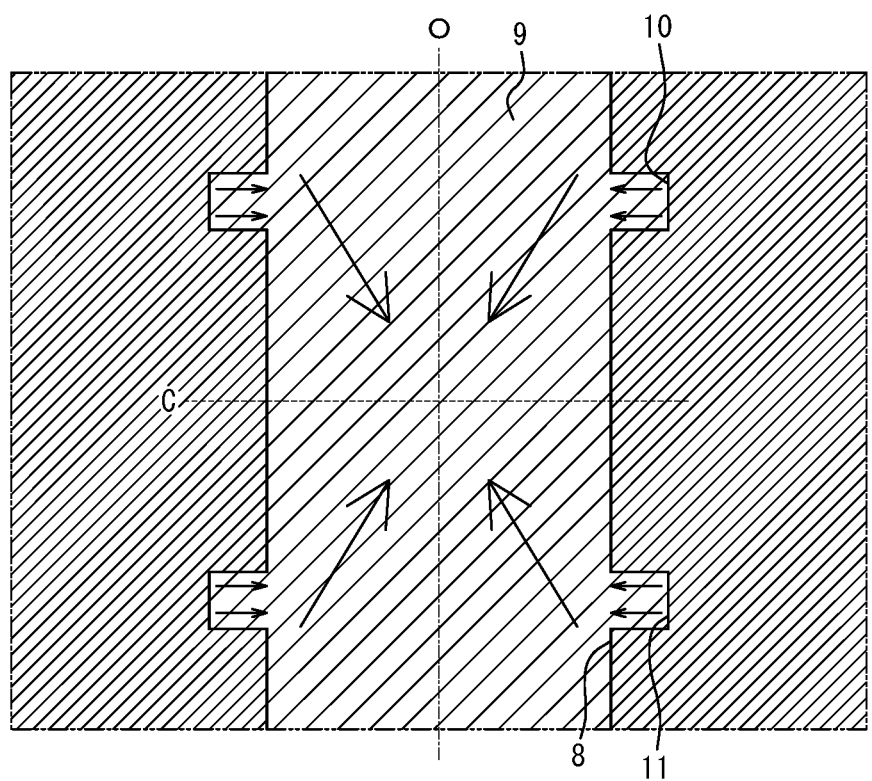
FIG. 4 is a cross-sectional diagram illustrating radial-direction thermal stress produced by the filler when the surrounding temperature falls at the filling portion illustrated in FIG. 1, the wiring being omitted from FIG. 4.

FIG. 4 illustrates the shear stress produced on the first peripheral groove 10 and the second peripheral groove 11 when the filler 9 contracts towards the center of the filler 9 due to a temperature change. In general, the joining surface is considered to exhibit excellent strength relative to a force acting in the shear direction. In the present embodiment, grooves including the first peripheral groove 10 and the second peripheral groove 11 are provided on the inner peripheral wall surface 8 of the filling portion 6. Hence, radially produced thermal stress can be received by the shear force of the upper and lower joining surfaces of the grooves, the force acting in the shear direction can be dispersed by the grooves, and the occurrence or progression of separation of the joining portion due to thermal stress can be suppressed. When the product operates in a wide temperature range or when the difference in the linear expansion coefficient between the filler 9 and the surrounding members is large, the number or radial length of the grooves can be increased to increase the joining area and strengthen the joining portion in a relatively easy manner.

The through substrate 22 also expands and contracts along with the filler 9 due to a temperature change. At this time, if the through substrate 22 is fixed to the case 12 or the like, thermal stress is produced at the joining surface of the through substrate 22 and the filler 9 due to the difference in the linear expansion coefficient between the case 12 or the like and the filler 9, and separation occurs at the joining surface. In the present embodiment, however, the upper end of the through substrate 22 is pinned, via the sliding connector 22c, slidably in the axial direction with respect to the connector 23b of the internal fixing substrate 23. Furthermore, the axial gap G is provided between the connector base of the sliding connector 22c of the through substrate 22 and the connector base of the connector 23b of the internal fixing substrate 23, ensuring electrical conduction while absorbing expansion and contraction of the through substrate 22 due to heat. The occurrence or progression of separation between the filler 9 and the through substrate 22 can thereby be suppressed. The size of the axial gap G between connectors and the extra length of the pin connecting portion between connectors can reduce the load on the joining portion between the through substrate 22 and the filler 9 when a temperature change occurs.

Furthermore, the explosion-proof structure 1 according to the present embodiment can achieve the following effects with regard to the explosion pressure produced by an explosion in the sealed space 3 of the container 2. When an explosion occurs in the sealed space 3 of the container 2, the filling portion 6 momentarily experiences a strong pressure from the sealed space 3 side. At this time, a peeling force such as tension or shear acts on the joining surface between the filler 9 and the surrounding members due to the explosion pressure. In the present embodiment, grooves including the first peripheral groove 10 and the second peripheral groove 11 are provided on the inner peripheral wall surface 8 of the filling portion 6. Hence, when an explosion occurs, a force pushes down (compresses) the lower surfaces of the first peripheral groove 10 and the second peripheral groove 11, suppressing the occurrence or progression of separation of the joining surface.

When the explosion in the sealed space 3 exerts pressure from above the filling portion 6, the filler 9 and the through substrate 22 experience a force that pushes downward. If the through substrate 22 is fixed to the case 12 or the like, a peeling force due to the explosion pressure acts on the joining surface between the through substrate 22 and the filler 9. In the present embodiment, however, the upper end of the through substrate 22 is connected to the internal fixing substrate 23 so as to form the radial gap G. Downward displacement of the through substrate 22 due to the explosion force can therefore be tolerated. This axial gap G can also reduce the load on the joining portion between the through substrate 22 and the filler 9 when an explosion occurs.

By thus being provided with a plurality of grooves including the first peripheral groove 10 and the second peripheral groove 11 in the filling portion 6, the explosion-proof structure 1 according to the present embodiment can strengthen the adhesive force with respect to thermal stress and explosion pressure. Accordingly, the explosion-proof structure 1 according to the present embodiment does not require a special sealing material, thereby reducing the number of components and lowering costs. A sealing material can, however, be additionally used as necessary.

In the present embodiment, the through substrate 22 is used instead of a cable (coated wire), thereby eliminating the steps for terminal processing or soldering of such a cable and achieving good workability during assembly. Furthermore, in the present embodiment, the external fixing substrate 21 that suppresses resin leakage and enables electrical conduction with the through substrate 22 passing through the filling portion 6 is connected perpendicularly to the through substrate 22. Workability during assembly therefore improves compared to when a cable or the like is used. When a cable is used, adhesion between the coated surface of the cable and the filler 9 tends to be poor, and explosion pressure might leak through the space (gap) between the interior of the cable coating and the core (conducting wire). The through substrate 22 is used instead of a cable in the present embodiment, however, yielding good adhesion with the filler 9. Moreover, a good seal can be obtained, since the aforementioned space does not exist.

The above embodiment is only an example embodiment of the present disclosure, and a variety of modifications may be made without departing from the scope of the present disclosure.

In the explosion-proof structure 1 of the above embodiment, the filling portion 6 only includes one filler 9. The filling portion 6 may, however, include another filler that is adjacent to the filler 9 on the sealed space 3 side of the filler 9 and that has a larger elasticity than the filler 9. The other filler may be a structural adhesive made of resin, such as silicone resin. Use of a highly elastic (soft) resin allows the other filler to closely follow deformation of the case 12 due to heat, thereby strengthening the seal of the filling portion 6 and increasing the ability to maintain the seal with respect to heat.

In the explosion-proof structure 1 of the above embodiment, the through substrate 22 is connected to the internal fixing substrate 23 via the sliding connector 22c. The through substrate 22 may, however, be connected to the internal fixing substrate 23 via a flexible cable or the like. Use of a flexible cable can achieve the same effects as the axial gap G as a result of the flexibility and elasticity of the flexible cable and also facilitates assembly by not requiring precise adjustment of the axial gap G.

In the explosion-proof structure 1 of the above embodiment, the through substrate 22 is a rigid substrate. The through substrate 22 may, however, be a flexible substrate. When the filler 9 deforms because of a temperature change or explosion pressure, the through substrate 22 configured as a flexible substrate can follow the displacement of the filler 9 and may therefore be fixed to the internal fixing substrate 23 via a connector.

In the explosion-proof structure 1 of the above embodiment, the inner peripheral wall surface 8 has a round cylindrical shape. The inner peripheral wall surface 8 may, however, have a different tubular shape, such as that of an elliptical cylinder or a polygonal cylinder.

In the explosion-proof structure 1 of the above embodiment, the cross-sectional shape of the first peripheral groove 10 and the second peripheral groove 11 is rectangular. The cross-sectional shape of the first peripheral groove 10 and the second peripheral groove 11 is not, however, limited to being rectangular. The first peripheral groove 10 and the second peripheral groove 11 are not limited to being independent grooves and may have a stepwise shape combining multiple grooves. The width and depth of the grooves, and the size of the R, C, or other such chamfering of the corners can be set appropriately.

In the explosion-proof structure 1 of the above embodiment, the first peripheral groove 10 and the second peripheral groove 11 are disposed on either side of the center C of the filler 9 in the axial direction. However, the arrangement of the first peripheral groove 10 and the second peripheral groove 11 in the axial direction in not limited to this case. To increase the joining area, for example, one or more other peripheral grooves filled with the filler 9 may be provided on the inner peripheral wall surface 8 in addition to the first peripheral groove 10 and the second peripheral groove 11.

In the explosion-proof structure 1 of the above embodiment, the partition wall 4 is formed by the outer wall of the container 2 and by the barrier wall 12c provided inside the container 2. The partition wall 4 may, however, be formed by the outer wall of the container 2 and the seal 17.

The invention claimed is:

1. An explosion-proof structure comprising:
   a partition wall that partitions a sealed space in a container; and
   wiring that connects an interior and an exterior of the sealed space;
   wherein the partition wall comprises a filling portion through which the wiring passes; and
   wherein the filling portion comprises
      an inner peripheral wall surface that defines an opening having a central axis that passes through the partition wall;
      a filler that seals a gap between the inner peripheral wall surface and the wiring;
      a first peripheral groove provided on the inner peripheral wall surface and filled with the filler; and
      a second peripheral groove provided on the inner peripheral wall surface and filled with the filler;
   wherein the wiring comprises a through substrate formed by a substrate that passes through the filling portion;
   wherein the wiring comprises an internal fixing member fixed to the container inside the sealed space; and
   wherein an axial gap is provided between the through substrate and the internal fixing member to allow the through substrate and the internal fixing member to approach each other closely in an axial direction along the central axis.

2. The explosion-proof structure of claim 1, wherein the through substrate comprises a sliding connector formed by a connector pinned slidably in the axial direction with respect to the internal fixing member.

3. The explosion-proof structure of claim 1, wherein the wiring comprises an external fixing member fixed to the partition wall so as to cover the opening at an outside of the sealed space.

4. The explosion-proof structure of claim 1, wherein the first peripheral groove and the second peripheral groove are disposed on either side of a center of the filler in an axial direction along the central axis.

5. The explosion-proof structure of claim 1, wherein the filler is made of resin.

6. The explosion-proof structure of claim 1, wherein the filling portion includes another filler that is adjacent to the filler and has a larger elasticity than the filler.

7. The explosion-proof structure of claim 1, wherein the container is a flameproof enclosure.

\* \* \* \* \*